United States Patent
Karhade et al.

(10) Patent No.: US 9,583,470 B2
(45) Date of Patent: Feb. 28, 2017

(54) ELECTRONIC DEVICE WITH SOLDER PADS INCLUDING PROJECTIONS

(71) Applicant: Intel Corporation, Santa Clara, CA (US)

(72) Inventors: Omkar Karhade, Chandler, AZ (US); Nitin Deshpande, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/135,209

(22) Filed: Dec. 19, 2013

(65) Prior Publication Data

US 2015/0179622 A1 Jun. 25, 2015

(51) Int. Cl.
| | |
|---|---|
| H01L 23/488 | (2006.01) |
| H01L 25/18 | (2006.01) |
| H01L 25/00 | (2006.01) |
| H01L 23/00 | (2006.01) |
| H01L 23/498 | (2006.01) |

(52) U.S. Cl.
CPC ........ *H01L 25/18* (2013.01); *H01L 23/49811* (2013.01); *H01L 23/49816* (2013.01); *H01L 24/13* (2013.01); *H01L 24/16* (2013.01); *H01L 24/81* (2013.01); *H01L 25/50* (2013.01); *H01L 2224/1131* (2013.01); *H01L 2224/13011* (2013.01); *H01L 2224/13147* (2013.01); *H01L 2224/16056* (2013.01); *H01L 2224/16059* (2013.01); *H01L 2224/16155* (2013.01); *H01L 2224/16238* (2013.01); *H01L 2224/8109* (2013.01); *H01L 2224/81193* (2013.01); *H01L 2224/81203* (2013.01); *H01L 2224/81345* (2013.01); *H01L 2224/81385* (2013.01); *H01L 2224/81801* (2013.01); *H01L 2224/81815* (2013.01); *H01L 2924/12042* (2013.01); *H01L 2924/1432* (2013.01); *H01L 2924/1434* (2013.01)

(58) Field of Classification Search
None
See application file for complete search history.

(56) References Cited

U.S. PATENT DOCUMENTS

| | | | | |
|---|---|---|---|---|
| 5,545,589 A | * | 8/1996 | Tomura | H01L 24/11 257/E21.508 |
| 5,828,128 A | * | 10/1998 | Higashiguchi | H01L 23/49816 257/737 |
| 5,929,521 A | * | 7/1999 | Wark | G01R 1/06738 257/692 |
| 5,939,786 A | * | 8/1999 | Downes, Jr. | H01L 21/4853 257/734 |
| 6,028,357 A | * | 2/2000 | Moriyama | H01L 23/24 257/737 |
| 6,043,150 A | * | 3/2000 | Downes, Jr. | H01L 21/4853 174/255 |

(Continued)

*Primary Examiner* — Hoang-Quan Ho
(74) *Attorney, Agent, or Firm* — Schwegman Lundberg & Woessner, P.A.

(57) ABSTRACT

An electronic device including a solder pad structure and methods of forming an electrical interconnection are shown. Solder pads including one or more projections extending from the pads are shown where the projections occupy only a fraction of a surface area of the pads. Processes such as thermal compression bonding using solder pads as described are also shown.

8 Claims, 7 Drawing Sheets

(56) References Cited

U.S. PATENT DOCUMENTS

| | | | | |
|---|---|---|---|---|
| 6,088,236 A * | 7/2000 | Tomura | H01L 24/11 | 174/259 |
| 6,172,422 B1 * | 1/2001 | Chigawa | H01L 21/563 | 257/673 |
| 6,246,587 B1 * | 6/2001 | Chen | H01R 4/04 | 174/260 |
| 6,303,993 B1 * | 10/2001 | Wark | G01R 1/0483 | 257/737 |
| 6,384,343 B1 * | 5/2002 | Furusawa | H01L 23/3107 | 174/250 |
| 6,469,394 B1 * | 10/2002 | Wong | H01L 23/49811 | 257/778 |
| 6,492,738 B2 * | 12/2002 | Akram | H01L 23/13 | 257/737 |
| 6,815,613 B2 * | 11/2004 | Gebauer | H01L 23/49816 | 174/541 |
| 6,841,872 B1 * | 1/2005 | Ha | H01L 23/3114 | 257/698 |
| 6,959,856 B2 * | 11/2005 | Oh | B23K 3/0623 | 228/180.22 |
| 7,015,590 B2 * | 3/2006 | Jeong | B23K 3/0607 | 257/738 |
| 7,078,822 B2 * | 7/2006 | Dias | H01L 21/563 | 257/773 |
| 7,170,187 B2 * | 1/2007 | Bernier | H01L 24/12 | 257/690 |
| 7,214,604 B2 * | 5/2007 | Kim | H01L 24/11 | 257/E21.508 |
| 7,300,864 B2 * | 11/2007 | Ma | H01L 24/11 | 257/E21.508 |
| 7,314,817 B2 * | 1/2008 | Dias | H01L 21/563 | 257/739 |
| 7,563,703 B2 * | 7/2009 | Brun | H01L 23/49811 | 257/E21.479 |
| 7,642,646 B2 * | 1/2010 | Nakamura | H01L 24/11 | 257/737 |
| 7,667,335 B2 * | 2/2010 | Lin | H01L 24/10 | 257/779 |
| 7,675,171 B2 * | 3/2010 | Lee | H01L 24/11 | 257/618 |
| 7,700,884 B2 * | 4/2010 | Casasnovas | H01L 23/49811 | 174/260 |
| 8,021,921 B2 * | 9/2011 | Lin | H01L 24/11 | 257/737 |
| 8,264,850 B2 * | 9/2012 | So | H01L 23/4006 | 361/767 |
| 8,294,279 B2 * | 10/2012 | Chen | H01L 21/563 | 257/686 |
| 8,409,979 B2 * | 4/2013 | Choi | H01L 23/49811 | 257/738 |
| 8,643,179 B2 * | 2/2014 | Im | H01L 23/49811 | 257/686 |
| 8,901,736 B2 * | 12/2014 | Shen | H01L 23/3157 | 257/773 |
| 2001/0045668 A1 * | 11/2001 | Liou | H01L 23/3171 | 257/778 |
| 2001/0054771 A1 * | 12/2001 | Wark | G01R 1/06738 | 257/786 |
| 2002/0053467 A1 * | 5/2002 | Gebauer | H01L 23/49816 | 174/260 |
| 2003/0234277 A1 * | 12/2003 | Dias | H01L 21/563 | 228/180.22 |
| 2004/0134974 A1 * | 7/2004 | Oh | B23K 3/0623 | 228/245 |
| 2004/0197979 A1 * | 10/2004 | Jeong | B23K 3/0607 | 438/202 |
| 2005/0104222 A1 * | 5/2005 | Jeong | H01L 23/16 | 257/778 |
| 2005/0208280 A1 * | 9/2005 | Dias | H01L 21/563 | 428/209 |
| 2005/0282315 A1 * | 12/2005 | Jeong | H01L 21/2885 | 438/125 |
| 2006/0113681 A1 * | 6/2006 | Jeong | B23K 3/0607 | 257/780 |
| 2007/0125571 A1 * | 6/2007 | Casasnovas | H01L 23/49811 | 174/260 |
| 2009/0242258 A1 * | 10/2009 | So | H01L 23/4006 | 174/260 |
| 2011/0233767 A1 * | 9/2011 | Sakurai | H01L 23/49811 | 257/737 |
| 2012/0306104 A1 * | 12/2012 | Choi | H01L 23/49811 | 257/782 |
| 2013/0299970 A1 * | 11/2013 | Harada | H01L 23/49827 | 257/737 |

* cited by examiner

ELECTRONIC DEVICE WITH SOLDER PADS INCLUDING PROJECTIONS

TECHNICAL FIELD

Embodiments described herein generally relate to electrical interconnections in microelectronic devices.

BACKGROUND

Microelectronic devices such as IC (integrated circuit) packages may include large numbers of solder pads and solder connections. With ever present pressure to decrease sizes of solder pads and to increase density of solder pads, technical challenges such as avoiding solder bridging between pads and avoiding open solder joints are becoming a larger problem.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

Figure 1:
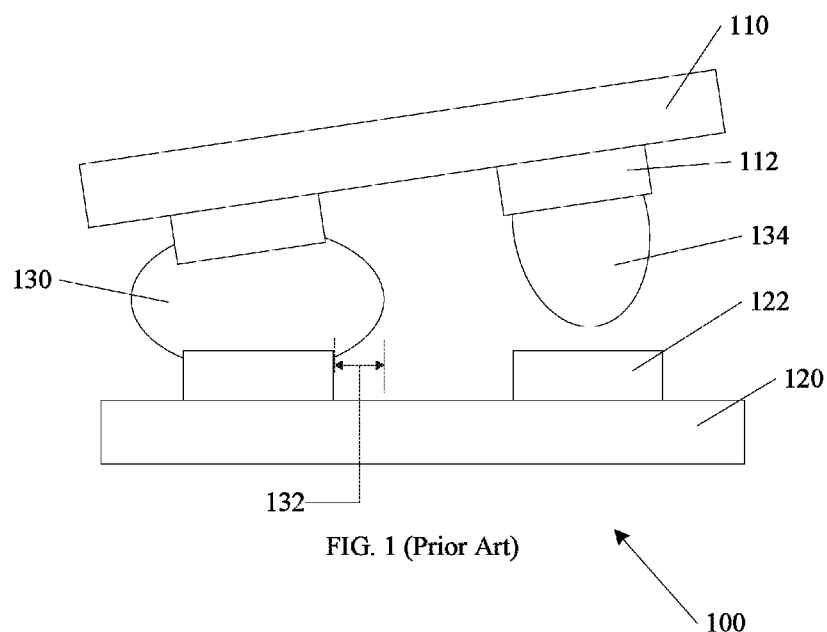
FIG. 1 is a cross section view of an electronic device connection configuration according to the prior art.

FIG. 1 shows a first electronic interconnection surface 110 and a second electronic interconnection surface 120 opposing one another. One common example of electronic interconnection surfaces includes a semiconductor chip being coupled to a package substrate. Other examples may include a package being coupled to a motherboard, a semiconductor chip being coupled to another semiconductor chip, a semiconductor chip being coupled to an interposer, etc.

In FIG. 1, the first electronic interconnection surface 110 is shown with a number of electrical connection pads 112, and the second electronic interconnection surface 120 is shown with a number corresponding electrical connection pads 122. One technical issue involving solder connections between surfaces such as surface 110 and 120 includes differences in flatness or other manufacturing variances that lead to differing heights of electrical connection pads 112, 122. This issue is illustrated in FIG. 1 by the slant of the first electronic interconnection surface 110 with respect to the second electronic interconnection surface 120.

With a given level of solder attach operation such as thermal compression bonding, or other solder attach operations, the variations in electrical connection pads 112, 122 may lead to undesirable conditions. One possibility includes solder 134 not contacting the adjacent pad 122 leaving an "open" condition. Another possibility includes solder 130 being over compressed and extending an excessive amount 132 in a lateral direction from the pad 122, which may lead to a short with an adjacent pad 122.

Figure 2A:
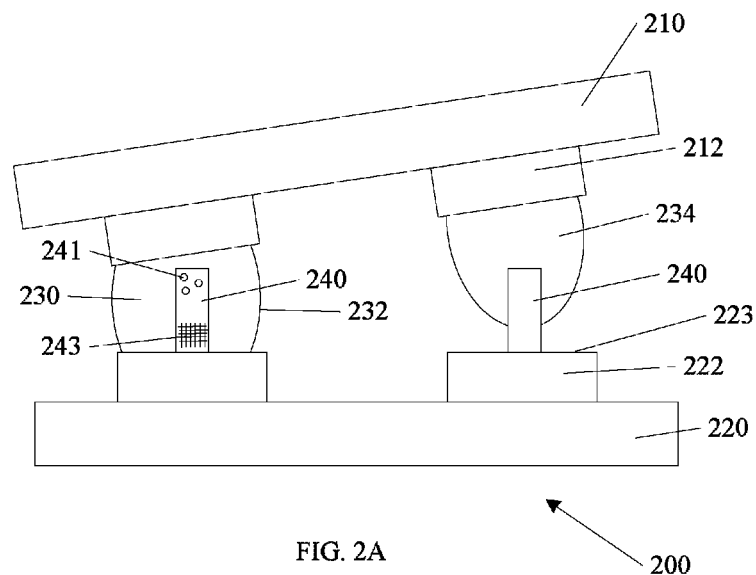
FIG. 2A is a cross section view of an electronic device connection configuration in accordance with some embodiments of the invention.

FIG. 2A shows an electronic device 200, including a first electronic interconnection surface 210 and a second electronic interconnection surface 220 opposing one another. The first electronic interconnection surface 210 is shown with a number of electrical connection pads 212, and the second electronic interconnection surface 220 is shown with a number corresponding electrical connection pads 222. The electrical connection pads 222 each include a substantially planar surface 223 that defines a surface area of the pads 222. A projection 240 is shown extending from each pad 222, where the projection 240 only occupies a fraction of the surface 223 of the pad 222.

Using a configuration as shown in FIG. 2A, solder ball 230 wets the lower pad 222, and the upper pad 212, and the projection 240. As a result of the projection 240, the solder wetting characteristics change, and an edge 232 of the solder ball 230 does not extend outside an edge of the pad 222, or extends less than an embodiment without the projection 240, thus reducing or removing the possibility of a short to adjacent pads 222. This provides increased reliability, and also provides a possibility of designing tighter pitch between pads 222.

Also shown in FIG. 2A, solder ball 234 contacts the projection 240, and is not left in an "open" condition. As a result of the projection 240, electrical connections are more reliable, even with a given amount of difference in height between pads 212 and 222.

Figure 2B:
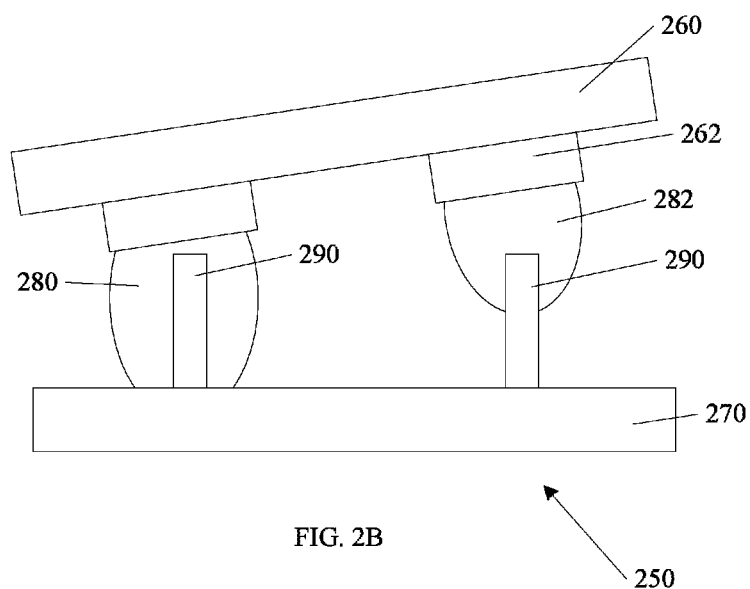
FIG. 2B is another cross section view of an electronic device connection configuration in accordance with some embodiments of the invention.

FIG. 2B shows another example of an electronic device 250, including a first electronic interconnection surface 260 and a second electronic interconnection surface 270 opposing one another. The first electronic interconnection surface 260 is shown with a number of electrical connection pads 262. A projection 290 is shown extending from the second electronic interconnection surface 270, where the projection 290 penetrates into first and second solder balls 280 and 282.

Using a configuration as shown in FIG. 2B, the first solder ball 280 forms an electrical connection between the projection 290 and the electrical connection pad 262. By penetrating into the first solder ball 280, the projection 290 reduces or eliminates spreading of excess solder and potential shorts to adjacent connections. This provides increased reliability, and also provides a possibility of designing tighter pitch between pads 262.

Also shown in FIG. 2B, solder ball 282 contacts the projection 290, and is not left in an "open" condition. As a result of the projection 290, electrical connections are more reliable, even with variation in height between pads 262.

Figure 3:
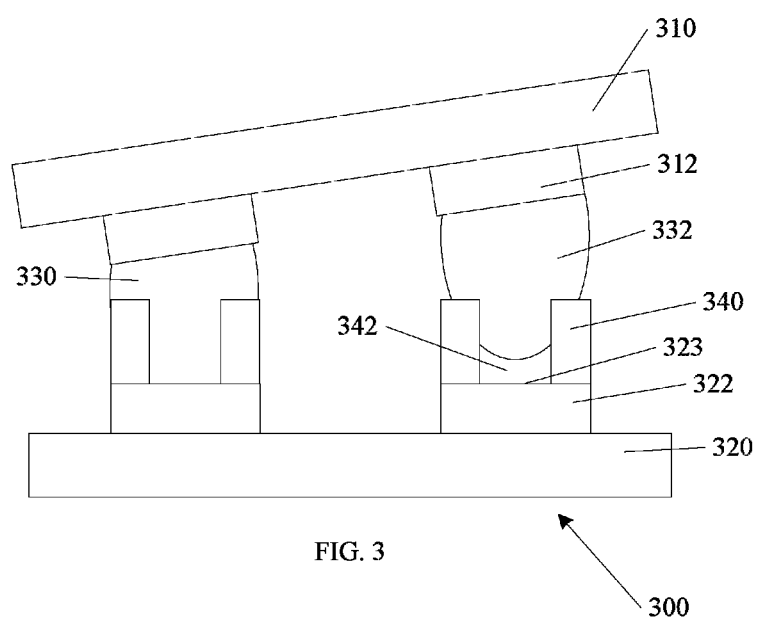
FIG. 3 is another cross section view of an electronic device connection configuration in accordance with some embodiments of the invention.

FIG. 3 shows a first electronic interconnection surface 310 and a second electronic interconnection surface 320 opposing one another. The first electronic interconnection surface 310 is shown with a number of electrical connection pads 312, and the second electronic interconnection surface 320 is shown with a number corresponding electrical connection pads 322. The electrical connection pads 322 each include a substantially planar surface 323 that defines a surface area of the pads 322. In the example shown in FIG. 3, more than one projection 340 is shown extending from each pad 322. As in other examples, the projections 340 only occupy a fraction of the surface 323 of the pad 322.

In the configuration shown in FIG. 3, two projections 340 are shown located on edges of the pad 322. In the configuration shown in FIG. 2A, a single projection 240 is located in a center of the pad 222. Although numbers of projections such as one or two, and locations in a center, or on edges of the pads are shown, the invention is not so limited. One of ordinary skill, having the benefit of the present disclosure, will recognize that other numbers of projections, and locations of projections are within the scope of the invention.

Using a configuration as shown in FIG. 3, solder ball 330 wets the lower pad 322, and the upper pad 312, and the projections 340. As a result of the projections 340, the solder wetting characteristics provide a solder ball 330 that does not extend outside an edge of the pad 322, thus reducing or removing the possibility of a short to adjacent pads 322. Also shown in FIG. 3, solder ball 332 contacts one or more of the projections 340, and is not left in an "open" condition. As a result of the projections 340, electrical connections are more reliable, even with a given amount of difference in height between pads 312 and 322.

Although the projections in the examples of FIGS. 2A, 2B, and 3 are shown only on a bottom surface, the invention is not so limited. One of ordinary skill, having the benefit of the present disclosure, will recognize that the projections may extend from a top electrical surface, or from both the bottom and the top electrical surface. Although projections are shown extending substantially normal to the electronic interconnection surfaces, the invention is not so limited. Other examples of projections may extend at various angles with respect to the electronic interconnection surfaces.

In selected examples, a number of openings are further included within the one or more projections that increase a surface area of the one or more projections and absorb excess solder. Examples of openings include a number of dimples, a number of pores 241, a mesh of wires 243, etc. that form the one or more projections. An addition of a number of openings within the projections further provides space for excess solder to be absorbed, and further reduces an amount of solder that may be extruded laterally and increase a likelihood of a short to adjacent connections.

Figure 4:
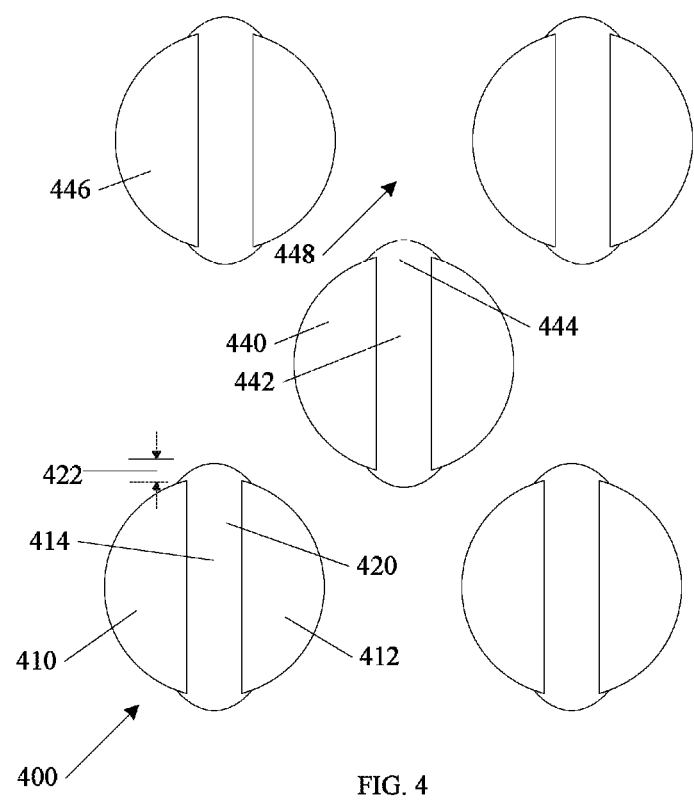
FIG. 4 is a top view of an array of solder pads in accordance with some embodiments of the invention.

FIG. 4 shows an array of electrical connection pads 400 according to one example. In the configuration of FIG. 4, each electrical connection pad 400 includes two projections 410 and 412, with a slot 414 between the projections 410 and 412. In a soldering operation, it is possible that some amount of solder 420 may extend an amount 422 over an edge of the pad 400. In the configuration shown in FIG. 4, the array of electrical connection pads 400 are aligned such that open ends of the slot 414 do not face other pads 400 that are directly adjacent.

For example, the solder 442 in pad 440 is shown extending an amount 444 over an edge of the pad 440. However because of the staggered configuration of the array, the amount 444 does not extend towards adjacent pad 446. Instead, the amount 444 extends into space 448. By arranging pads 400 with projections and slot formations as described, any excess solder that may extend over an edge of the pads 400 is much less likely to cause a short to adjacent pads 400.

Figure 5:
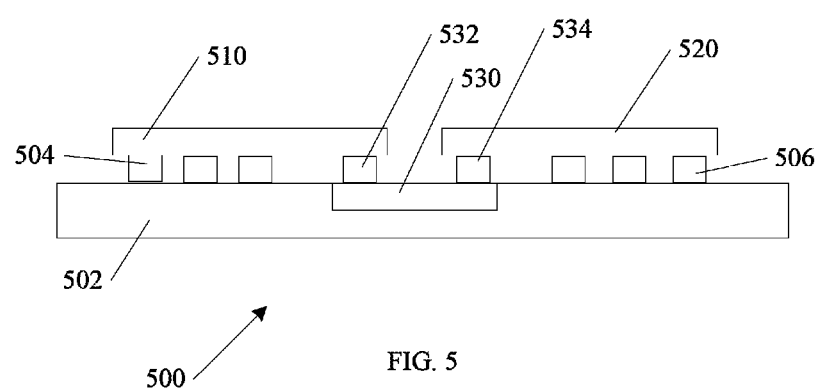
FIG. 5 is a cross section view of an IC package in accordance with some embodiments of the invention.

FIG. 5 shows an integrated circuit (IC) package 500 according to one example. The IC package 500 includes a first semiconductor chip 510 coupled to a substrate 502 using a number of interconnections 504. In one example, the number of interconnections 504 include one or more pads with projections as described in embodiments above. A second semiconductor chip 520 is also shown in the IC package 500 example of FIG. 5. The second semiconductor chip 520 is coupled to the substrate 502 using a number of interconnections 506. In one example, the number of interconnections 506 include one or more pads with projections as described in embodiments above.

In one example, the first semiconductor chip 510 includes a processor chip, and the second semiconductor chip 520 includes a memory chip, although other types of semiconductor chips are also within the scope of the invention.

The IC package 500 of FIG. 5 further shows bridge 530 at least partially embedded in the substrate 502. The bridge 530 is shown coupling the first semiconductor chip 510 to the second semiconductor chip 520 through interconnections 532 and 534. In one example, the number of interconnections 532 and 534 also include one or more pads with projections as described in embodiments above.

As shown in FIG. 5, the substrate 502 and the bridge 530 form multiple opposing surfaces to the semiconductor chips 510, 520. Such a configuration presents a challenge to keep all pads at a consistent height for forming solder connections as described above. In one example the bridge 530 includes a silicon bridge that is formed using a finer pitch of interconnects that the substrate 502. In one example using pads and projections as described above, variations in pitch such as between the substrate and the bridge 530 and variations in pad height can be easily accommodated with improved reliability from defects such as shorts or open connections.

Figure 6:
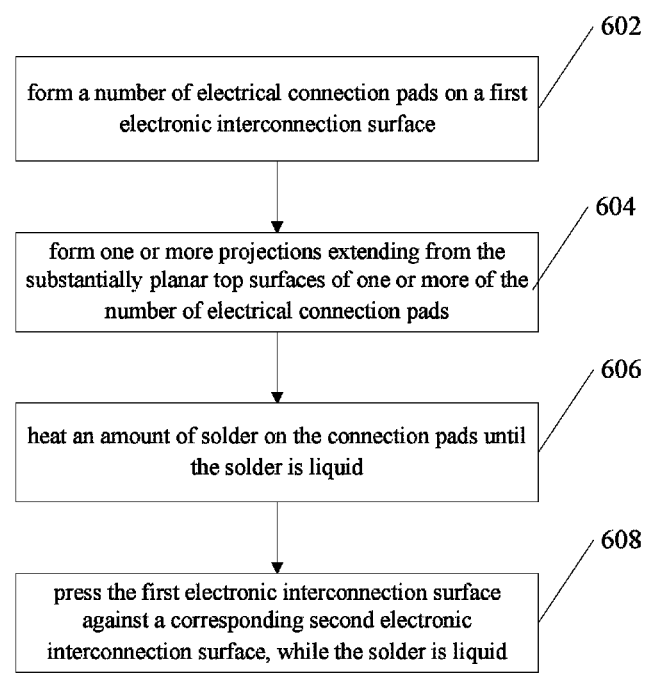
FIG. 6 is a process diagram of a method in accordance with some embodiments of the invention.

FIG. 6 shows a flow diagram of a method of forming an electronic device according to an embodiment of the invention. In operation 602, a number of electrical connection pads are formed on a first electronic interconnection surface. The connection pads, as described in examples above, include a substantially planar top surface having a first surface area. In operation 604, one or more projections are formed, extending from the substantially planar top surfaces of one or more of the number of electrical connection pads. As described in examples above, the one or more projections occupy only a fraction of the first surface area.

In one example, the one or more projections are formed using an additive process. For example, lithographic techniques may be used to mask off a portion of the electrical connection pads, and material may be added to build up the one or more projections at a chosen location on the electrical connection pads. Examples of additive processes may include, but are not limited to, chemical deposition, physical deposition, etc.

In one example, the one or more projections are formed using an subtractive process. For example, lithographic techniques may be used to mask off a portion of the electrical connection pads, and material may be removed from the electrical connection pads, leaving behind the one or more projections at a chosen location on the electrical connection pads. Examples of subtractive processes may include, but are not limited to, chemical etching, physical sputtering, laser etching, etc.

In one example, the one or more projections are formed using a mechanical forming process. Examples may include pressing in, or otherwise deforming a portion of the electrical connection pads, creating the one or more projections at a chosen location on the electrical connection pads.

In operation 606 of FIG. 6, an amount of solder is placed on the connection pads and heated until the solder is liquid. In one example, a thermal compression bonding (TCB) device is used to heat the solder. Although TCB is used as an example, other heating and/or bonding devices may be used within the scope of the invention.

In operation 608, the first electronic interconnection surface is pressed against a corresponding second electronic interconnection surface, while the solder is liquid, until the one or more projections contact corresponding connection pads on the second electronic interconnection surface.

In prior examples of TCB, solder was placed on an electronic interconnection surface in solid form, and a first electronic interconnection surface was pressed against a corresponding second electronic interconnection surface. Because the solder is solid, a force may be detected when the two electronic interconnection surfaces make contact. Detecting contact with solid solder provides a reference distance between opposing pads to leave room for the solder connection. If the first electronic interconnection surface is pressed against a corresponding second electronic interconnection surface with liquid solder, no contact force is detected, and the solder may extrude out from sides of connection pads, causing unwanted short circuit conditions.

In the prior example of TCB, after the reference distance is established using force detection of solid solder, the solder is then heated to liquefy the solder, wet the corresponding pad surfaces. The solder is subsequently cooled to complete the connection between the first electronic interconnection surface and the second electronic interconnection surface.

Performing all the operations of detecting contact using solid solder, heating the solder, and cooling the solder can take a considerable amount of time to complete in a large scale manufacturing operation. Using a method as described in operations 606 and 608 above, a TCB process time can be reduced. A reference distance between pads is detected by contact of one or more projections as described in examples above, with an opposing pad or an opposing projection, while the solder is liquid. The liquid solder either does not extrude beyond edges of the pads, or does not extrude far enough to cause shorting, because the projections provide space for the solder between the opposing pads. Because the solder can be liquid when establishing the reference distance between opposing pads, a process time for a TCB operation can be substantially reduced.

Figure 7:
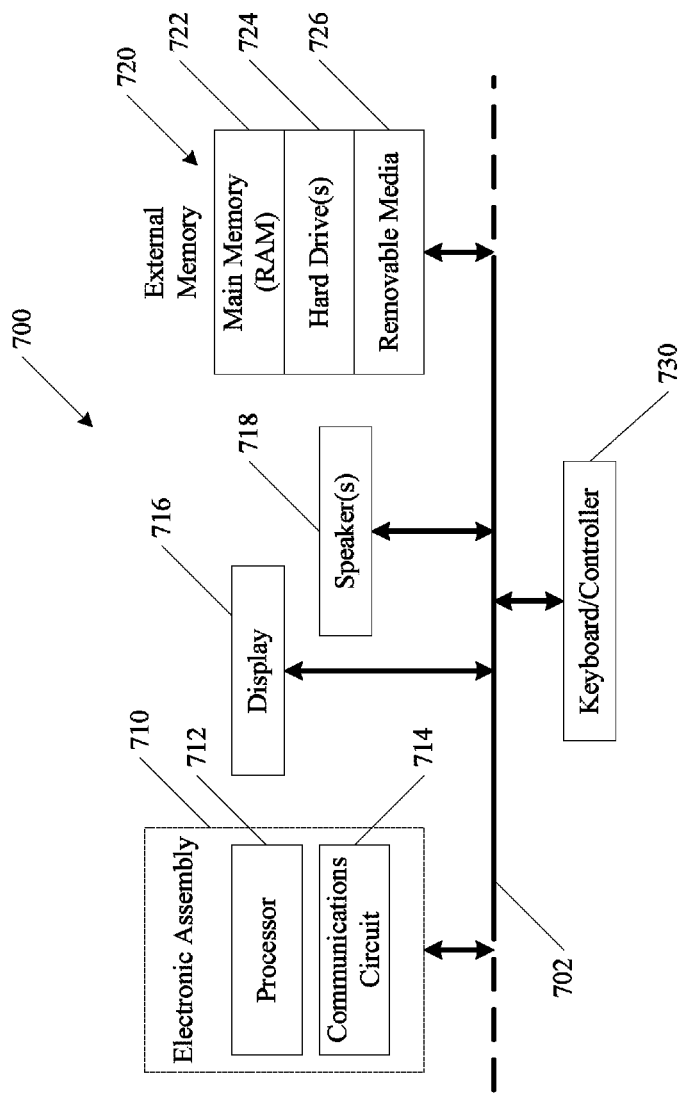
FIG. 7 is block diagram of an electronic system in accordance with some embodiments of the invention.

An example of an electronic device using electronic devices and solders as described in the present disclosure is included to show an example of a higher level device application for the present invention. FIG. 7 is a block diagram of an electronic device 700 incorporating at least one solder interconnection and/or method in accordance with at least one embodiment of the invention. Electronic device 700 is merely one example of an electronic system in which embodiments of the present invention can be used. Examples of electronic devices 700 include, but are not limited to personal computers, tablet computers, mobile telephones, game devices, MP3 or other digital music players, etc. In this example, electronic device 700 comprises a data processing system that includes a system bus 702 to couple the various components of the system. System bus 702 provides communications links among the various components of the electronic device 700 and can be implemented as a single bus, as a combination of busses, or in any other suitable manner.

An electronic assembly 710 is coupled to system bus 702. The electronic assembly 710 can include any circuit or combination of circuits. In one embodiment, the electronic assembly 710 includes a processor 712 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 710 are a custom circuit, an application-specific integrated circuit (ASIC), or the like, such as, for example, one or more circuits (such as a communications circuit 714) for use in wireless devices like mobile telephones, tablet computers, laptop computers, two-way radios, and similar electronic systems. The IC can perform any other type of function.

The electronic device 700 can also include an external memory 720, which in turn can include one or more memory elements suitable to the particular application, such as a main memory 722 in the form of random access memory (RAM), one or more hard drives 724, and/or one or more drives that handle removable media 726 such as compact disks (CD), flash memory cards, digital video disk (DVD), and the like.

The electronic device 700 can also include a display device 716, one or more speakers 718, and a keyboard and/or controller 730, which can include a mouse, trackball, touch screen, voice-recognition device, or any other device that permits a system user to input information into and receive information from the electronic device 700.

To better illustrate the method and apparatuses disclosed herein, a non-limiting list of embodiments is provided here:

Example 1 includes an electronic device with an electronic interconnection surface, including a number of electrical connection pads, the connection pads including a substantially planar top surface having a first surface area. The electronic device includes one or more projections extending from the substantially planar top surfaces of one or more of the number of electrical connection pads, wherein the one or more projections occupy only a fraction of the first surface area.

Example 2 includes the electronic device of example 1, wherein the electronic interconnection surface is an IC package substrate.

Example 3 includes the electronic device of any one of examples 1-2, wherein the electronic interconnection surface is a semiconductor chip surface.

Example 4 includes the electronic device of any one of examples 1-3, wherein the number of electrical connection pads include a number of copper pads.

Example 5 includes the electronic device of any one of examples 1-4, wherein the one or more projections include a single column in a center of the electrical connection pad.

Example 6 includes the electronic device of any one of examples 1-5, wherein the one or more projections include two projections located on edges of the electrical connection pad.

Example 7 includes the electronic device of any one of examples 1-6, wherein the one or more projections include two portions of a cylinder extending from the electrical connection pad with a slot formed between them.

Example 8 includes the electronic device of any one of examples 1-7, wherein the number of electrical connection pads each include two portions of a cylinder extending from the electrical connection pad with a slot formed between them, and wherein the slots are aligned such that open ends of slots do not face other electrical connection pads that are directly adjacent.

Example 9 includes an IC package, having at least one semiconductor chip coupled to one or more opposing surfaces through a number of pairs of electrical connection pads, each of the connection pads including a substantially planar surface, and one or more projections extending from at least one of the connection pads in a given pair, wherein the one or more projections occupy only a fraction of a surface area of the connection pad, and an amount of solder forming an electrical connection between the opposite facing electrical connection pads.

Example 10 includes the IC package of example 9, wherein the one or more opposing surfaces include a package substrate.

Example 11 includes the IC package of any one of examples 9-10, wherein the semiconductor chip includes a processor chip.

Example 12 includes the IC package of any one of examples 9-11, wherein the one or more opposing surfaces include an embedded bridge.

Example 13 includes the IC package of any one of examples 9-12, further including a memory chip mounted adjacent to the processor chip, wherein the memory chip is coupled to the processor chip through the embedded bridge.

Example 14 includes the IC package of any one of examples 9-13, wherein the one or more projections extend from connection pads on only the semiconductor chip in the given pair.

Example 15 includes the IC package of any one of examples 9-14, wherein the one or more projections extend from connection pads on only the one or more opposing surfaces in the given pair.

Example 16 includes the IC package of any one of examples 9-15, wherein the one or more projections extend from both connection pads in the given pair.

Example 17 includes a method, including forming a number of electrical connection pads on a first electronic interconnection surface, the connection pads including a substantially planar top surface having a first surface area, forming one or more projections extending from the substantially planar top surfaces of one or more of the number of electrical connection pads, wherein the one or more projections occupy only a fraction of the first surface area, heating an amount of solder on the connection pads until the solder is liquid, and pressing the first electronic interconnection surface against a corresponding second electronic interconnection surface, while the solder is liquid, until the one or more projections contact corresponding connection pads on the second electronic interconnection surface.

Example 18 includes the method of example 17, wherein pressing the first electronic interconnection surface against a corresponding second electronic interconnection surface includes thermal compression bonding.

Example 19 includes the method of any one of examples 17-18, wherein pressing the first electronic interconnection surface against a corresponding second electronic interconnection surface includes detecting contact between corresponding connection pads using a force sensor.

Example 20 includes the method of any one of examples 17-19, wherein forming one or more projections includes removing material from an electrical connection pad, leaving the projection.

Example 21 includes the method of any one of examples 17-20, wherein forming one or more projections includes adding material to an electrical connection pad, to form the projection.

Example 22 includes the method of any one of examples 17-21, wherein forming one or more projections includes mechanical deformation of an electrical connection pad to form the projection.

Example 23 includes an IC package including at least one semiconductor chip coupled to one or more opposing surfaces through a number of solder balls. The IC package further includes one or more projections extending from at least one of the one or more opposing surfaces, wherein the one or more projections penetrates into a corresponding solder ball.

Example 24 includes the IC package of example 23, wherein the one or more projections include a number of openings within the one or more projections than increase a surface area of the one or more projections and absorb excess solder.

Example 25 includes the IC package of any one of examples 23-24, wherein the number of openings includes a porous structure.

Example 26 includes the IC package of any one of examples 23-25, wherein the number of openings includes a mesh of wires.

These and other examples and features of the present electronic device, solder compositions, and related methods will be set forth in part in the following detailed description. This overview is intended to provide non-limiting examples of the present subject matter—it is not intended to provide an exclusive or exhaustive explanation. The detailed description below is included to provide further information about the present molds, mold systems, and methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An IC package, comprising:
   at least one semiconductor chip coupled to one or more opposing surfaces through a number of solder balls;
   one or more projections extending from at least one of the one or more opposing surfaces including a number of electrical connection pads, the connection pads including a substantially planar top surface having a first surface area, wherein the one or more projections occupy only a fraction of the first surface area, wherein the one or more projections penetrates into a corresponding solder ball wherein the one or more projections include a number of openings within the one or more projections that increase a surface area of the one or more projections and absorb excess solder, wherein the number of openings includes a mesh of wires.

2. The IC package of claim 1, wherein the one or more opposing surfaces include a package substrate.

3. The IC package of claim 2, wherein the semiconductor chip includes a processor chip.

4. The IC package of claim 3, wherein the one or more opposing surfaces include an embedded bridge.

5. The IC package of claim 1, wherein the one or more projections extend from connection pads on only the semiconductor chip in the given pair.

6. The IC package of claim 1, wherein the one or more projections extend from connection pads on only the one or more opposing surfaces in the given pair.

7. The IC package of claim 4, further including a memory chip mounted adjacent to the processor chip, wherein the memory chip is coupled to the processor chip through the embedded bridge.

8. The IC package of claim 1, wherein the one or more projections extend from both connection pads in the given pair.

* * * * *